United States Patent [19]

von der Lippe et al.

[11] Patent Number: 5,316,786
[45] Date of Patent: May 31, 1994

[54] METHOD FOR THE TREATMENT OF STEEL-HYBRID PRINTED CIRCUIT BOARDS

[75] Inventors: Norbert von der Lippe, Moers; Rudolf Graener, Erkrath; Peter Sommer, Frechen, all of Fed. Rep. of Germany

[73] Assignee: Rheinmetall GmbH, Dusseldorf, Fed. Rep. of Germany

[21] Appl. No.: 820,069

[22] Filed: Jan. 9, 1992

[30] Foreign Application Priority Data

Jan. 9, 1991 [DE] Fed. Rep. of Germany ... 4100393.4

[51] Int. Cl.$^5$ .............................................. C23C 26/00
[52] U.S. Cl. ..................................... 427/96; 427/180; 427/299; 427/327; 427/444
[58] Field of Search ................. 427/96, 180, 299, 444, 427/327

[56] References Cited

U.S. PATENT DOCUMENTS 3,007,997 11/1961 Panaviti ............................... 427/96
3,956,528 5/1976 Ugro ..................................... 427/96

OTHER PUBLICATIONS

S. Timoshenko et al. "Elements of Strength of Materials" 4th ed. Van Nostrand Co. 1962, pp. 197-199, 213.

Patent Abstracts of Japan, vol. 4, No. 119 (C-22)23, Aug. 1990.
Patent Abstracts of Japan, vol. 13, No. 132 (E-736)31, Mar. 1989.
Patent Abstracts of Japan, vol. 12, No. 237 (C-509) 6, Jul. 1988.

Primary Examiner—Shrive Beck
Assistant Examiner—Vi Duong Dang
Attorney, Agent, or Firm—Spencer, Frank & Schneider

[57] ABSTRACT

A method of pre-treating steel-hybrid circuit board substrates or carrier plates before the application of coatings that are to be burnt in or fired. In prior art steel-hybrid circuit boards of this type, the burning-in of the coatings in a kiln produces undesirable warping of the circuit boards due to the different coefficients of thermal expansion of the materials employed for the coatings and for the carrier plates, unless relatively thick steel-hybrid circuit board carrier plates are employed. This warping is avoided, while still permitting the use of steel hybrid circuit boards of a lesser thickness, by pre-treating the steel-hybrid circuit board carrier plates to provide same with a mechanical pre-stress causing a defined curvature which compensates for the warping of the circuit board to be expected during burn-in.

10 Claims, 1 Drawing Sheet

METHOD FOR THE TREATMENT OF STEEL-HYBRID PRINTED CIRCUIT BOARDS

CROSS-REFERENCE TO RELATED APPLICATIONS

This application is related to Applicants' concurrently filed U.S. application Ser. No. 07/819,366 corresponding to Federal Republic of Germany application P 41 00 393.6 filed Jan. 9th, 1991.

This application claims the priority of Federal Republic of Germany application Serial No. P 41 00 393.4 filed Jan. 9th, 1991, which is incorporated herein by reference.

BACKGROUND OF THE INVENTION

The present invention relates to a method of pretreating steel-hybrid printed circuit boards, particularly those which are intended to be provided with surface mounted electronic components, before coatings that are to be burnt in or fired are applied.

It is known to produce steel-hybrid circuit boards of this type in that a carrier plate in the form of a steel-hybrid base plate is covered with various electrically conductive and electrically insulating coatings, respectively, which after their respective application are fired in a conventional kiln.

One problem encountered in the production of such circuit boards is that at the customary firing temperatures in the kiln, the differences in coefficients of thermal expansion of the carrier material (here the steel-hybrid or substrate) and of the respective coating produce different thermal stresses. As the person skilled in the art is aware, in the past this has always resulted in warping of the fired circuit board.

In the past, and as a remedy and solution of the above-described problem, a very thin coating has been applied to a rather thick steel-hybrid carrier. Thin coatings, however, exhibit adhesion problems and frequently result in undue electrical breakdown voltages. Moreover, thick steel-hybrid carrier plates have an undesirably high weight, frequently increase the time required for the entire manufacturing process, and are expensive. Thus, to obtain a circuit board that is not noticeably warped it has been necessary to revert, for example, to a carrier plate thickness of about 4–6 mm for a coating thickness of 150 μm.

Because of the problems described above, so-called multi-layer steel-hybrid circuit boards having planar conductor paths in different layers have not yet been able to be produced.

SUMMARY OF THE INVENTION

It is therefore an object of the present invention to provide a method of pre-treating steel-hybrid circuit board carriers before coatings requiring burn-in or firing are applied so that disadvantageous thermal stresses developed during the subsequent burn-in process are compensated whereby thinner steel-hybrid circuit board carrier plates can be utilized and the steel-hybrid circuit boards can be produced in multi-layer technology.

This object is achieved according to the present invention by a method of pre-treating steel-hybrid circuit boards which are to be provided on one surface with coatings of pastes of other materials which are to be burnt in, and which, due to different thermal stresses developed in the different materials of the coatings and of the circuit boards during the burn-in process, would tend to warp, with the method comprising mechanically pre-stressing the circuit board, prior to the application of the coating, to provide a desired, controlled curvature in the circuit board for compensating any warping due to the different thermal stresses developed during a subsequent burn-in process.

By charging the steel-hybrid circuit board carrier plates to be employed as provided by the present invention, it becomes possible to estimate or calculate the warping of the circuit board to be expected during burn-in of the intended coating and to compensate the warping quasi beforehand by impressing mechanical pre-stresses into the carrier plate before it is coated.

As an advantageous feature of the invention, the initial pre-stress warping of the carrier plate required for compensation is effected by deforming the circuit board either in a conventional press or by particle jet-blasting of the surface of the circuit board. A particle jet-blasting process is frequently employed in any case to clean the circuit board plates or to remove coatings from the plates, which is required before paste coatings are applied, so that this jetblasting process simply can be expanded for a longer period of time in the desired manner to achieve the desired curvature.

The method according to the invention is particularly suitable for the production of multi-layer steel-hybrid circuit boards in connection with which relatively thin steel-hybrid plates can be employed, resulting in savings of time, cost and weight.

The invention will be described and explained below in greater detail with reference to the drawing figures.

DETAILED DESCRIPTION OF THE PREFERRED EMBODIMENTS

Figure 1:
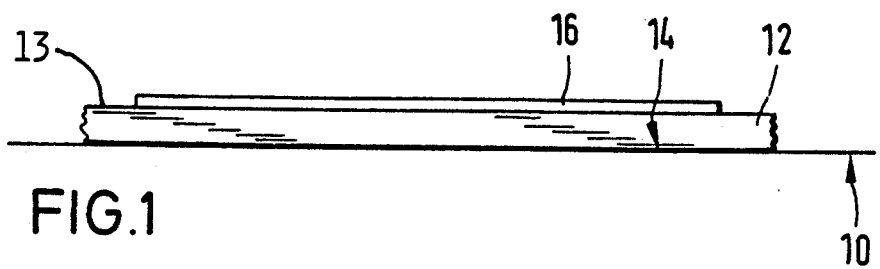
FIG. 1 schematically shows a conventional steel-hybrid circuit board with an applied coating before the burn-in process.

FIG. 1 shows a known steel-hybrid circuit board carrier plate 12 whose side 14 free of added components lies flat on a support 10. A coating 16, for example a thick-film paste, is applied to the upper surface 13 of the circuit board 12 in a known manner. Circuit board 12 is thus ready for a burn-in process, e.g. in a kiln, to burn in or fire coating 16 in a likewise known manner.

Figure 2:
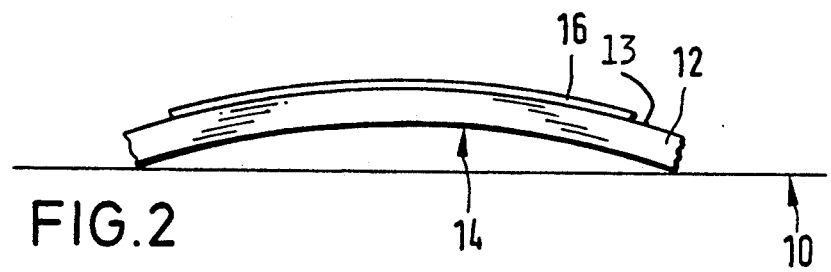
FIG. 2 schematically shows the conventional steel-hybrid circuit board of FIG. 1 after the burn-in process.

FIG. 2 shows the circuit board or plate 12 of FIG. 1, which has been provided with a coating 16, after the burn-in process. In particular, FIG. 2 shows warping of circuit board 12, which is known to the person skilled in the art and which is caused by the different thermal stresses developed in the steel-hybrid circuit board 12 and in the thick-film paste of coating 16 during the burn-in process. As FIG. 2 indicates, after the burn-in process, the coated surface 13 of circuit board 12 is convex so that the uncoated side of circuit board 12 lifts off of the support 10.

Since further or additional coating and burn-in processes are known to cause even greater, undesirable warping of the circuit board 12, multi-layer circuit boards of this type customarily have not been manufactured in the past.

Figure 3:
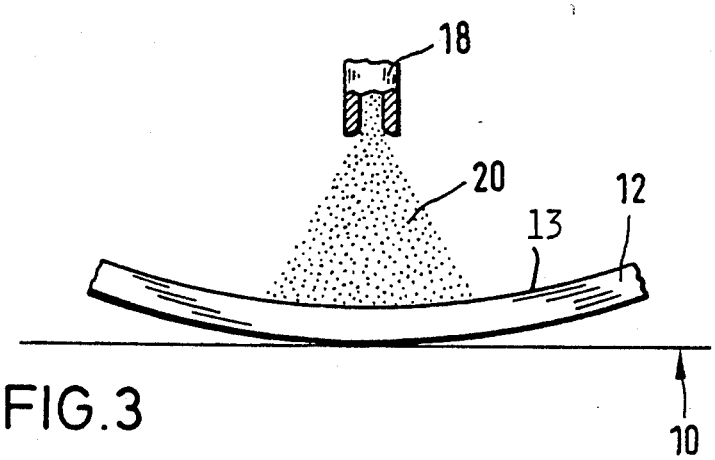
FIG. 3 schematically shows a steel-hybrid circuit board before the coating is applied being mechanically prestressed according to one embodiment of the method according to the invention.

FIG. 3 shows one embodiment of the method of pre-treating the steel-hybrid circuit board 12 according to the present invention, and in particular for the example of the coating of a mechanical pre-stress in the board by extended particle jet-blasting of the upper surface 13 of the steel-hybrid circuit board 12. In this case, the circuit board 12 is clamped into a holding device (not shown) where the surface 13 is blasted with a jet of particles or granules.

Customarily a particle jet-blasting of such circuit boards 12 is effected before the coating process so as to clean, degrease and generally pre-treat the surface of the circuit board 12 that is to be coated, e.g. the surface 13. For the purpose of clarification, FIG. 3 shows the nozzle of a conventional particle jet-blasting device 18 and the granules 20 blasted onto the surface 13 of the plate 12. The granules 20 used for this purpose preferably are granules of a metallic material. Such granules may be, for example, of the type according to DIN (German Industrial Standard) for hard cast granulate, polygonal G12.

According to the present invention, the particle jet-blasting process e.g., the blasting process used for cleaning, is continued until a desired pre-stressed controlled curvature of circuit board 12 has been attained. The degree of the desired pre-stress curvature is determined by the requirement for compensation of the warping of the circuit board 12 in the direction opposite to the direction of the pre-stress curvature that otherwise would occur during the burn-in process. As shown, the board 12 is pre-stressed so that the surface 13 becomes concave. Due to past experiences during burn-in of coatings on steel-hybrid circuit boards, the person of average skill in the art knows or is able to determine the degree of the curvature or warpage to be expected during burn-in as a function of the thickness of the circuit board 12 and of the thickness of the coating or coatings 16, respectively.

Instead of producing the desired pre-stress curvature of circuit board 12 by extension of the particle jet-blasting process, the desired curvature may of course also be effected by controlled pressing of the board 12 in the sense of cold-shaping. For example, this type of pre-shaping or pre-stressing of circuit board 12 may be combined with the process of cutting out the circuit board 12.

Figure 4:
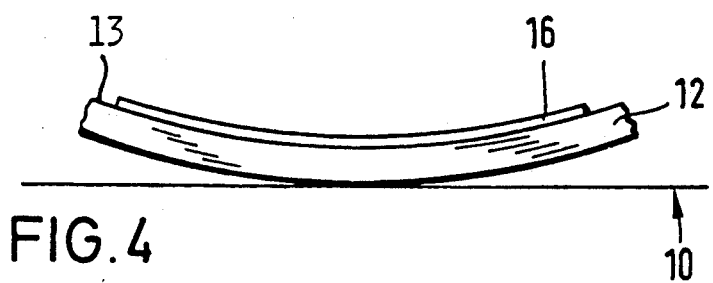
FIG. 4 schematically shows a steel-hybrid circuit board which has been pre-treated according to the method of the invention after the coating has been applied.

FIG. 4 shows a circuit board 12 that has been pre-treated according to the invention and with the coating 16, a thick-film paste, already applied, but before the burn-in process.

Figure 5:
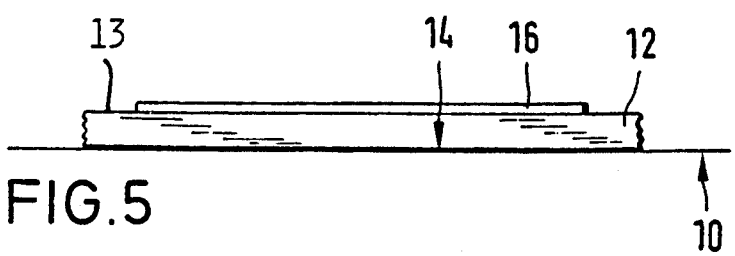
FIG. 5 schematically shows a circuit board which was pre-treated according to the invention and subsequently coated, i.e. the circuit board of FIG. 4, after the burn-in process.

FIG. 5 shows the circuit board 12 according to FIG. 4 provided with coating 16 after the burn-in or firing of the thick-film paste forming coating 16. The otherwise customarily occurring warping of circuit board 12 (see FIG. 2) is compensated by the pre-treatment according to the present invention shown in FIG. 3 to the extent that the un-coated side 14 of circuit board 12 again lies flat on the support 10.

With the method according to the invention, the thickness of the substrate board can extend over a range of 0.5 mm to about 6 mm for a coating thickness in the range of 20 to about 400 μm. As a specific example of an unwarped steel-hybrid board formed according to the invention, a base plate in the form of a disk having a diameter of 100 mm and a thickness of 1.5 mm formed of material according to DIN 1.4016 was used. The surface of the disk then was subjected to sandblasting with DIN G12 hard cast material with a sandblaster operating according to the turbine blade principle, two passes of the sandblaster for a time of 2 minutes were used to produce the desired curvature of the disk. Thereafter a thick film cement paste of the type designated as IP211 sold by the Hereaus/Cermalloy was applied to the concave surface of the disk, and then the coated disk was fired for 60 minutes at a peak temperature of 950° C. to produce the desired unwarped disk.

The invention now being fully described, it will be apparent to one of ordinary skill in the art that any changes and modifications can be made thereto without departing from the spirit or scope of the invention as set forth herein.

What is claimed is:

1. A method of pre-treating steel-hybrid circuit boards which are to be provided on one surface with coatings of pastes which are to be burnt in, and which, due to different thermal stresses developed in the materials of the coatings and in the circuit boards during the burn-in process, would tend to warp, said method comprising mechanically pre-stressing the circuit board, prior to the application of the coating, to provide a desired, controlled curvature of the circuit board which compensates for any warping due to the different thermal stresses developed during a subsequent burn-in process, and then coating and firing.

2. A method as defined in claim 1 wherein said step of mechanically pre-stressing comprises pressing the circuit board to provide the desired curvature.

3. A method as defined in claim 1 wherein said step of mechanically pre-stressing comprises blasting the surface of the circuit board with a jet of granules of granulates until the desired degree of curvature has been attained.

4. A method as defined in claim 3 wherein granules of a metallic material are employed during the blasting of the surface of the circuit board.

5. In a method of producing as circuit board including applying a coating of a paste material on a surface of a flat steel-hybrid board, and firing the paste material, whereby different thermal stresses developed during the firing process in the coating and in the board tend to produce warpage of the flat board; the improvement comprising: prior to said step of applying, mechanically pre-stressing said flat steel-hybrid board to produce a controlled curvature in a direction opposite that of the warping produced by said different thermal stresses to compensate for the warping.

6. A method as defined in claim 6 wherein said direction of controlled curvature causes said surface of said board to become concave.

7. A method as defined in claim 5 wherein said step of mechanically pre-stressing comprises pressing the board to said desired controlled curvature.

8. A method as defined in claim 5 further comprising blasting said surface of said board with a jet of granules to clean said surface prior to said step of applying; and wherein said step of mechanically pre-stressing comprises continuing said step of blasting until the desired degree of controlled curvature has been attained.

9. A method as defined in claim 8 wherein said granules are formed of a metallic material.

10. A method as defined in claim 5 wherein said step of mechanically pre-stressing comprises blasting said surface of said board with a jet of granules until the desired degree of controlled curvature has been attained.

* * * * *